United States Patent [19]
Banan et al.

[11] Patent Number: 5,676,751
[45] Date of Patent: Oct. 14, 1997

[54] RAPID COOLING OF CZ SILICON CRYSTAL GROWTH SYSTEM

[75] Inventors: Mohsen Banan, St. Louis; Harold W. Korb, Ballwin; Kyong-Min Kim, St. Charles, all of Mo.

[73] Assignee: MEMC Electronic Materials, Inc., St. Peters, Mo.

[21] Appl. No.: 589,491

[22] Filed: Jan. 22, 1996

[51] Int. Cl.$^6$ ................................................. C30B 25/20
[52] U.S. Cl. .......................... 117/13; 117/15; 117/208
[58] Field of Search ...................... 117/13, 14, 15, 117/200, 208

[56] References Cited

U.S. PATENT DOCUMENTS

| | | | |
|---|---|---|---|
| 3,615,878 | 10/1971 | Chang et al. | 117/13 |
| 4,135,963 | 1/1979 | Fukuda | 117/13 |
| 4,140,570 | 2/1979 | Voltmer et al. | 117/3 |
| 4,299,651 | 11/1981 | Bonner | 117/13 |
| 4,406,731 | 9/1983 | Chartier | 117/13 |
| 5,178,720 | 1/1993 | Frederick | 117/20 |
| 5,288,366 | 2/1994 | Holder | 114/33 |
| 5,394,825 | 3/1995 | Schmid et al. | |

FOREIGN PATENT DOCUMENTS 2207627  2/1989  United Kingdom ................. 117/13

*Primary Examiner*—Felisa Garrett
*Attorney, Agent, or Firm*—Senniger, Powers, Leavitt & Roedel

[57] ABSTRACT

A Czochralski method for producing monocrystals wherein a single crystal silicon rod is pulled from a silicon melt contained in a crucible within a chamber. After pulling the single crystal silicon rod from a silicon melt in a chamber, the chamber is cooled by flowing a gas having a thermal conductivity of at least about $55 \times 10^{-5}$ g.cal./(sec.-cm$^2$)(°C./cm) at 800° K into the chamber. The preferred cooling gas is a helium-containing gas.

20 Claims, 2 Drawing Sheets

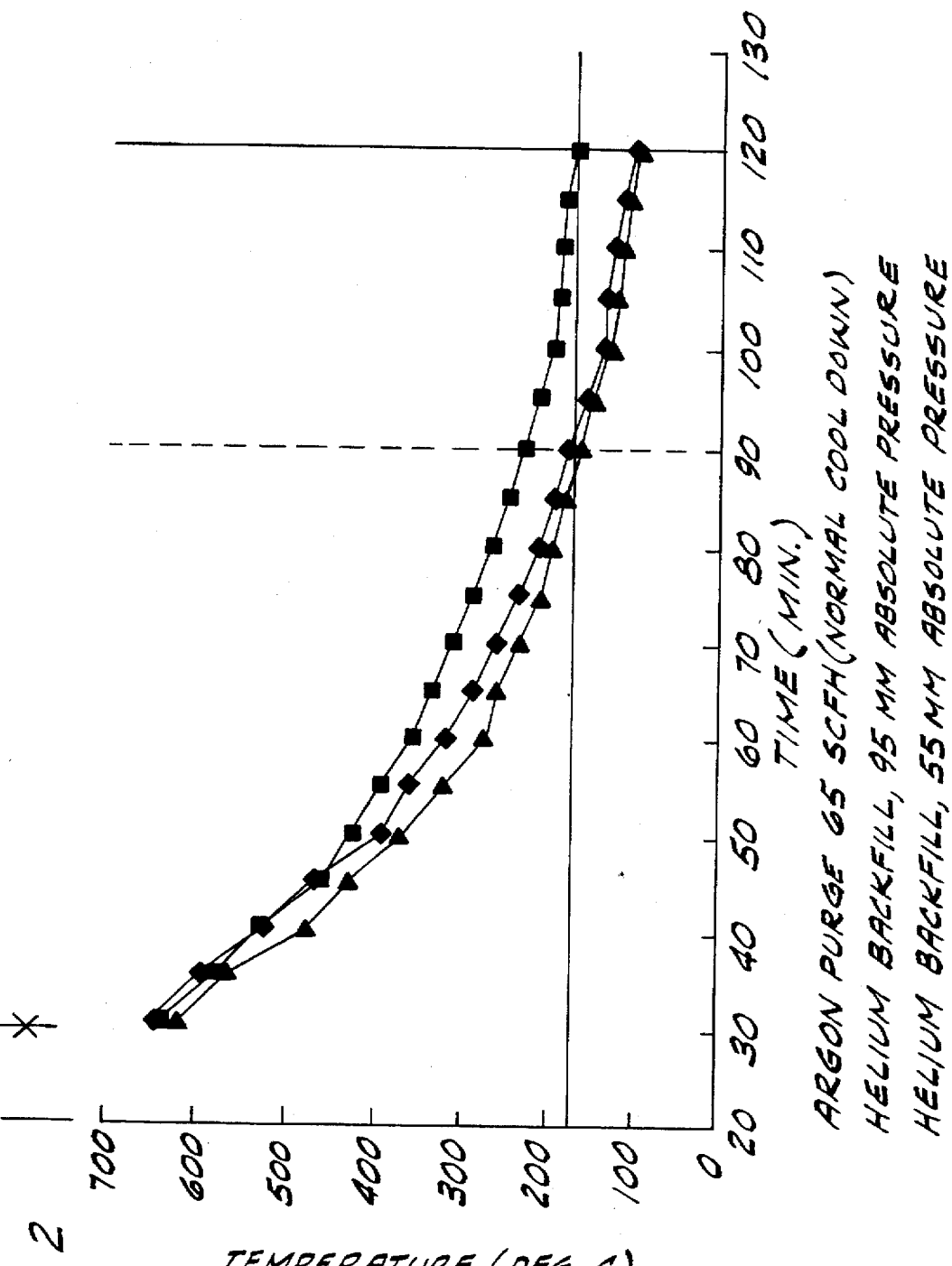

5,676,751

RAPID COOLING OF CZ SILICON CRYSTAL GROWTH SYSTEM

BACKGROUND OF THE INVENTION

This invention relates generally to method for growing single crystal silicon and more particularly to a method for cooling a crystal growth system used in a Czochralski (CZ) silicon growth process.

The substantial majority of monocrystalline silicon which is used to make silicon chips for the solid-state electronics industry is produced by the CZ method. Briefly described, this method involves melting chunks of high-purity polycrystalline silicon in a quartz crucible located in a specifically designed furnace to form a silicon melt. Argon gas is typically purged through the furnace as gas flows out of the furnace via a vacuum system. A relatively small seed crystal is mounted above the crucible on a pulling wire which can raise and lower the seed crystal. The crucible is rotated and the seed crystal is lowered into contact with the molten silicon in the crucible. When the seed begins to melt, and after thermal equilibration, it is slowly withdrawn from the molten silicon and starts to grow, drawing silicon from the melt. After pulling is completed, the flow of argon is continued in order to assist in cooling the crystal, furnace, and associated components to about 200° C. Cooling is necessary for the safety of personnel and because certain components of the system would rapidly degrade if exposed to air at too high temperature. After cooling, one may flow argon into the furnace to increase the internal pressure to about atmospheric so that the furnace can be opened and prepared for growing another crystal. A disadvantage of this process is that cooling is relatively slow, typically taking two to five hours. Productivity suffers because the crystal puller cannot be prepared for the next crystal growing operation until the system is cool enough to be opened.

SUMMARY OF THE INVENTION

Among the several objects and features of the present invention may be noted the provision of a CZ silicon crystal growing method characterized by a rapid cooling operation which permits preparation of the CZ furnace sooner than in previous methods; a CZ crystal growing method characterized by increased productivity; a CZ crystal growing apparatus which facilitates more rapid cooling and which provides increased productivity.

Briefly, therefore, the invention is directed to a Czochralski method for producing monocrystals wherein a single crystal silicon rod is pulled from a silicon melt contained in a crucible within a chamber. The method involves cooling the chamber by flowing a gas having a thermal conductivity of at least about $55 \times 10^{-5}$ g.cal./(sec.-cm$^2$)(°C./cm at 800° K into the chamber.

The invention is also directed to a Czochralski method involving cooling the chamber by flowing a helium-containing gas into the chamber after the crystal is pulled.

The invention is further directed to a method of cooling a monocrystal within a crystal pulling apparatus of the type which produces monocrystals by the Czochralski method, the crystal pulling apparatus including a growth chamber, a crucible in the growth chamber, a pulling chamber above the growth chamber, a heating apparatus within the growth chamber for heating the crucible, insulation in the growth chamber and disposed generally circumferentially about the heating apparatus for resisting heat losses from the crucible, and a cooling apparatus disposed generally circumferentially about the insulation for cooling the crucible. The method involves evacuating the growth chamber after the crystal has been pulled; energizing the cooling apparatus; introducing an inert gaseous fluid having a thermal conductivity of at least about $55 \times 10^{-5}$ g.cal./sec.-cm$^2$)(°C./cm) at 800° K into the growth chamber; and holding the inert gaseous fluid in the growth chamber to increase the cooling effectiveness of the cooling apparatus.

The invention is also directed to a Czochralski method for pulling a single crystal silicon rod from a silicon melt in a crucible within the chamber while purging the chamber with a continuous flow of an inert gas and maintaining the crucible and the chamber interior at a temperature greater than about 500° C. and at a pressure of less than about 1 torr by application of a vacuum to the chamber. The method involves discontinuing the flow of inert gas to the chamber and discontinuing the application of vacuum to the chamber while the crucible and chamber interior are at a temperature of at least about 500° C.; flowing a helium-containing gas into the chamber and thereby increasing the pressure within the chamber to at least about 50 torr; and cooling the chamber by maintaining the pressure within the chamber at least about 50 torr until the temperature of the chamber interior and crucible are below about 250° C.

The invention is also directed to a Czochralski method for pulling a single crystal silicon rod from the silicon melt in the crucible within the chamber while maintaining the temperature of the crucible and the chamber interior at a temperature of at least about 500° C. The method involves cooling the crucible and chamber interior to a temperature below about 250° C. by infiltrating pores of the insulation with a helium-containing gas to increase the insulation's thermal conductivity, thereby causing heat to be pulled away from the crucible and chamber interior.

The invention is further directed to a Czochralski method for pulling a single crystal silicon rod from a silicon melt in the crucible within the chamber while purging the chamber with a continuous flow of an inert gas and maintaining the crucible and the chamber interior at a temperature greater than about 500° C. and at a pressure of less than about 1 torr by application of a vacuum to the chamber. The method involves discontinuing the flow of inert gas to the chamber and discontinuing the application of vacuum to the chamber while the crucible and chamber interior are at a temperature of at least about 500° C.; flowing a helium-containing gas into the chamber to increase the pressure within the chamber to at least about 50 torr and to infiltrate pores of the insulation with the helium-containing gas, thereby increasing the thermal conductivity of the insulation and the rate at which the insulation causes heat to be pulled away from the crucible and chamber interior; and cooling the crucible and chamber interior to a temperature below about 250° C. by maintaining the pressure within the chamber at at least about 50 torr until the temperature of the chamber interior and crucible are below about 250° C.

Still further, the invention is directed to a Czochralski method in which the chamber and the crucible are heated to a temperature of at least about 500° C. by application of a heat source thereto and a single crystal silicon rod is pulled from the silicon melt in the crucible within the chamber while purging the chamber with a continuous flow of an inert gas at a flowrate of between about 20 and about 150 liters per minute and maintaining the crucible and the chamber interior at a temperature greater than about 500° C. and at a pressure of less than about 1 torr by application of a vacuum to the chamber. The method involves discontinuing application of the heat source; discontinuing flow of inert gas to the chamber and discontinuing the application of vacuum to the chamber while the crucible and chamber interior are at a temperature of at least about 500° C.; flowing an inert gas containing at least 70% helium by volume into the chamber to increase the pressure within the chamber to at least about 50 torr and to infiltrate pores of the insulation with the gas containing at least 70% helium by volume, thereby increasing the thermal conductivity of the insulation and the rate at which the insulation causes heat to be pulled away from the crucible and chamber interior; and cooling the crucible and chamber interior to a temperature below about 250° C. by maintaining the pressure within the chamber at at least about 50 torr until the temperature of the chamber interior and crucible are below about 250° C.

Other objects and features of the present invention will be in part apparent and in part pointed out hereinafter.

BRIEF DESCRIPTION OF THE DRAWINGS

FIG. 2 is a graphical presentation of a comparison of cooldown time of a helium backfill process to an argon purge process.

DETAILED DESCRIPTION OF THE PREFERRED EMBODIMENTS

Figure 1:
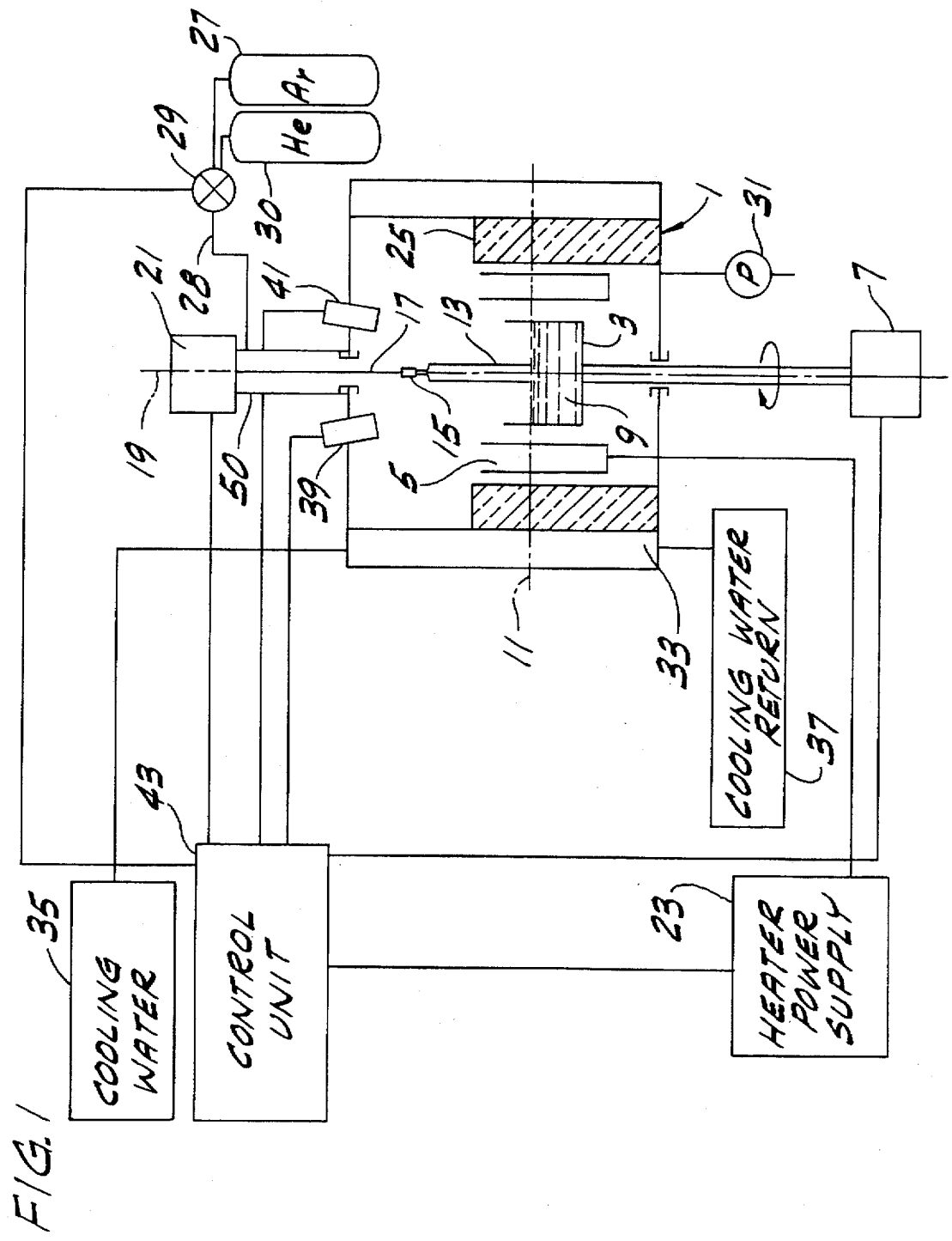
FIG. 1 is a sectional view of a CZ crystal growth apparatus of the invention for use in accordance with the method of the invention.

Referring now to FIG. 1, a CZ crystal growth apparatus for use in accordance with the present invention is illustrated. Within vacuum chamber 1 is crucible 3 surrounded by resistance heater 5. Crucible drive unit 7 rotates the crucible in the clockwise direction as indicated by the arrow and raises and lowers the crucible as necessary. Within crucible 3 is silicon melt 9 having melt level 11 and from which single crystal 13 is pulled, starting with seed crystal 15 attached to pull shaft or cable 17. Crucible 3 and single crystal 13 have common axis of symmetry 19. Pull shaft or cable 17 is rotated in the counterclockwise direction and raised and lowered as necessary by crystal drive unit 21. Heater power supply 23 energizes resistance heater 5 and insulation 25 lines the inner wall of the vacuum chamber. Argon gas is fed to vacuum chamber 1 from a bottle 27 via a gas flow controller 29 as gas is removed from the vacuum chamber by vacuum pump 31. Surrounding the vacuum chamber is chamber cooling jacket 33 which is fed with cooling water from a reservoir 35. The cooling water is then drained to cooling water return manifold 37. A photo cell 39 measures the melt surface temperature and diameter transducer 41 measures the diameter of the single crystal 13. Their signals are processed by control unit 43. This control unit may be a programmed digital computer or analog controller; it controls crucible and single crystal drive units 7 and 21, heater power supply 23, pump 31 and gas flow controller 29. In one embodiment the apparatus also has solenoid coils and associated components to facilitate growing the silicon crystal in the presence of a cusp magnetic field, as disclosed in co-assigned U.S. Pat. No. 5,178,720, the entire disclosure of which is expressly incorporated herein by reference. After the crystal growing operation is completed, the flow of argon is terminated and helium gas is fed to vacuum chamber 1 from a helium source 30 (e.g., bottled helium) via a gas line 28. A gas flow controller (e.g., valve 29 controlled by control unit 43) regulates the flow of helium through gas line 28.

To grow a silicon single crystal, a quantity of polysilicon is charged to crucible 3 and an electric current is passed through heater 5 to melt the charge. The silicon melt can also contain certain dopants which are introduced for the purpose of modifying the electrical characteristics of the silicon as known in the art. An inert gas such as argon is fed to the vacuum chamber as gas is removed from the crystal growth chamber by vacuum pump 31 to continually purge the system during the polysilicon melting and crystal growing operations. The inert gas flowrate depends in part on the size of the chamber, but for a typical system is at least about 30 liters/minute, preferably between about 20 and about 150 l/min, more preferably between about 30 and about 130 l/min. The pressure within the vacuum chamber during the crystal pulling operation is maintained between about 10 and about 20 torr, preferably between about 10 and about 15 torr.

A seed crystal 15 is lowered to make contact with the melt and then slowly withdrawn from the melt, and the silicon solidifies on the seed to produce the growth of a single crystal. A cylindrical single crystal rod 13 is obtained by rotating the crystal at a predetermined rate as it is drawn. The crucible is similarly rotated at a second predetermined rate, but in the opposite direction relative to the rod. The withdrawing rate and power to the heater are initially controlled to cause the formation of a neck and then adjusted to cause the diameter of the crystal to increase in a cone shaped manner until a predetermined crystal diameter is reached. The withdrawal rate and heating are then controlled so as to maintain constant diameter until the process approaches an ending. At that point, the withdrawal rate and heating are increased so that the diameter decreases to form a cone portion at the end of the single crystal rod.

After the single crystal 13 reaches the predetermined diameter (for example, 150 mm or 200 mm) the rotation rates of the single crystal and crucible are controlled to regulate the concentration and distribution of oxygen therein, both axially and radially. The rotation rate of the crucible is typically between 1 and 10 rpm, preferably at least about 4 rpm, and the rotation rate of the single crystal is substantially greater than the rotation rate of the crucible, i.e., is typically about 10 to 20 rpm and at least about 5 rpm greater than the rotation rate of the crucible. In addition, to avoid the formation of waves in the molten silicon the rotation rates of the crucible and single crystal are controlled so that their sum does not exceed a predetermined value. The predetermined value is determined empirically for each system and is dependent upon the diameter of the single crystal, the diameter of the crucible and the amount of silicon charged to the crucible.

Upon completion of the growing operation, the crystal is lifted to an upper chamber above the crystal growth chamber housing the crucible. Sealing of the upper chamber from the lower chamber is optional, as the method of cooling as described below assists in cooling the crystal, if the atmospheres between the upper and lower chambers are left in communication. The flow of argon is terminated and the chamber housing the crucible is evacuated via pump 31 to a pressure of less than about 1 torr, preferably between about 0.05 and about 0.5 torr, more preferably to about 0.1 torr. Helium is then introduced into the chamber at a flowrate of at least about 50 liters/min., preferably between about 100 and about 300 l/min, more preferably between about 150 and about 250 l/min. Although referred to herein as "helium," the use of either helium or a helium-containing gas is effective. If other than pure helium is used, a helium-containing gas contains at least about 50% helium by volume. Preferably, the helium-containing gas contains at least about 70% helium by volume, more preferably at least about 90% helium by volume. Where less than all of the gas is helium, neon and/or argon are the preferred remainder constituents. Exemplary gases include 90He/10Ar, 80He/20Ar, and 70He/30Ar. The temperature of the helium entering the chamber is between about 10° C. and about 20° C., preferably between about 15° C. and about 20° C. The application of vacuum is terminated so that the chamber becomes backfilled with helium at a pressure of at least about 50 torr, preferably between about 50 and about 760 torr, more preferably between about 50 and about 300 torr, most preferably about 200 torr.

Although evacuating the chamber between argon purging and helium backfilling as described above is preferred, the method can alternatively be carried out without evacuation of the chamber before introducing helium. This alternative cools slightly less efficiently, because argon occupies space within the chamber which would otherwise be occupied by helium. As part of this alternative, it is preferred to purge the system with helium to replace argon therewith before backfilling with helium.

Upon backfilling the helium seeps into pores of insulation 25, which is preferably rigid fibrous graphite insulation of the type, for example, available from Calcarb Ltd. under the product designation C.B.C.F. The porosity of the insulation is preferably at least about 60%, more preferably between about 60 and about 90%, most preferably between about 85 and about 85%. The helium, because it has good heat transfer characteristics, improves the thermal conductivity of the insulation when it infiltrates the insulation's pores to form an insulation system comprising insulation and infiltrated helium. The helium infiltration thereby increases the cooling rate of the hot components in the system through the insulation system. The hot components which are cooled include the crucible, graphite susceptor, base, heater, heat shield, and insulation. In particular, the thermal conductivity of helium is about $77.5 \times 10^{-5}$ g.cal./(sec.·cm$^2$)(°C./cm) at 800° K (thermal conductivity changes with temperature). The water jacket 33 more effectively cools the system on account of the increase in thermal conductivity of the insulation system infiltrated with helium.

Once the desired amount of helium is flowed to the system and the desired pressure is reached, the flow of helium is terminated. Helium flow is thereafter optionally resumed periodically to compensate for pressure reduction due to cooling. As an alternative to complete termination of helium flow, it is reduced to a flowrate sufficient to maintain the system pressure within the desired range, accounting for pressure reduction due to cooling.

A further optional step in the operation is to evacuate the system after the helium has been heated and replace it with a new supply of unheated helium. It is also effective to remove heated helium from the chamber, circulate it through a cooling system, and recycle it back to the chamber.

In an alternative embodiment of the invention, the system is continually purged with helium during cooling, rather than backfilled to the stated pressure. Although this alternative represents an increase in cooling rate as compared to prior processes, it has been discovered that an even greater increase in cooling rate is accomplished by backfilling with helium according to the procedures described above. Furthermore, this purging alternative requires a greater quantity of helium than does the backfilling procedure.

In a further alternative embodiment of the invention, a gas other than helium is used. The preferred alternative gas is neon or a neon-containing gas. The thermal conductivity of neon is about $20 \times 10^{-5}$ g.cal./(sec.·cm$^2$)(°C./cm) at 800° K. Using hydrogen is a further alternative (with a thermal conductivity between that of neon and helium), but is less preferred due to the danger of explosion. The gas used, whether it is a helium-containing gas or an alternative, is inert to the crystal in that it does not react with the crystal or otherwise contaminate it. The gas used is also inert to the crystal pulling system in that it does not react significantly with the systems components and does not leave contaminants which could result in contamination of the crystal in a subsequent crystal growing system. The gas used in connection with this invention has a thermal conductivity of at least about $55 \times 10^{-5}$ g.cal./(sec.·cm$^2$)(°C./cm) at 800° K, preferably at least about $62 \times 10^{-5}$ g.cal./(sec.·cm$^2$)(°C./cm) at 800° K, and more preferably at least about $70 \times 10^{-5}$ g.cal./(sec.·cm$^2$)(°C./cm) at 800° K. In alternative embodiments, the gas used in connection with this invention has a thermal conductivity of between about $55 \times 10^{-5}$ and $80 \times 10^{-5}$ g.cal./(sec.·cm$^2$)(°C./cm) at 800° K, preferably between about $62 \times 10^{-5}$ and $80 \times 10^{-5}$ g.cal./(sec.·cm$^2$)(°C./cm) at 800° K, and more preferably between about $70 \times 10^{-5}$ and $80 \times 10^{-5}$ g.cal./(sec.·cm$^2$)(°C./cm) at 800° K. Argon, which may be mixed with helium in one of the particular embodiments described above, has a thermal conductivity of about $8.8 \times 10^{-5}$ g.cal./(sec.·cm$^2$)(°C./cm) at 800° K.

The method of the invention can be used in connection with crystal growing systems which must be opened between the growth of each rod, and can also be used in connection with continuous systems in which two or more rods are pulled in succession without opening the puller. These continuous systems must still be cooled and opened after a multiple of runs, at which time it is advantageous to practice the rapid cooling method of this invention.

EXAMPLES

Single crystal silicon rods (150 mm nominal diameter were pulled from a 350 mm diameter crucible containing a 34 kg polysilicon charge using the apparatus of FIG. 1, in particular, a Hamco 3000 crystal puller. The rate of rotation of the crystal was between 10 and 20 rpm and the rate of rotation of the crucible was fixed at 15 rpm. Upon completion of the growth cycle, the heater was turned off and the chamber was evacuated to about 0.1 torr. Helium was then introduced into the chamber at a flow rate of about 50 std ft$^3$/hr until the pressure within the chamber reached about 95 torr. The temperature of the chamber interior was monitored using a thermocouple positioned adjacent the heat shield. The process was repeated under the same conditions, except that the helium was flowed into the chamber until the pressure within the chamber reached about 55 torr.

FIG. 2 presents a comparison of these two exemplary processes to a conventional process in which the system is purged/backfilled with argon during cooling. As shown in FIG. 2, by using a helium backfill during cooldown in accordance with the invention, the cooldown time of the puller interior to about 180° C. was surprisingly reduced by about 25%, from about 120 minutes to about 90 minutes. By reducing the cooldown time in this manner, the puller can be prepared for a next crystal growing operation sooner, thereby increasing productivity. Such improvements in productivity translate into reduced capital requirements as the number of operating crystal pullers can be reduced without a reduction in output.

In view of the above, it will be seen that the several objects of the invention are achieved and other advantageous results attained.

As various changes could be made in the above methods without departing from the scope of the invention, it is intended that all matter contained in the above description shall be interpreted as illustrative and not in a limiting sense.

What is claimed is:

1. A Czochralski method for producing monocrystals wherein a single crystal silicon rod is pulled from a silicon melt contained in a crucible within a chamber, the method comprising:

cooling the chamber by flowing a gas having a thermal conductivity of at least about $55 \times 10^{-5}$ g.cal./(sec.·cm$^2$) (°C./cm) at 800° K into the chamber after the single crystal silicon rod is pulled from the silicon melt.

2. The process of claim 1 wherein the gas has a thermal conductivity of at least about $62 \times 10^{-5}$ g.cal./(sec.·cm$^2$)(°C./cm) at 800° K.

3. The process of claim 1 wherein the gas has a thermal conductivity of at least about $70 \times 10^{-5}$ g.cal./(sec·cm$^2$)(°C./cm) at 800° K.

4. The process of claim 1 wherein the gas has a thermal conductivity of between about $55 \times 10^{-5}$ and $80 \times 10^{-5}$ g.cal./(sec.·cm$^2$)(°C./cm) at 800° K.

5. The process of claim 1 wherein the gas has a thermal conductivity of between about $62 \times 10^{-5}$ and $80 \times 10^{-5}$ g.cal./(sec.·cm$^2$)(°C./cm) at 800° K.

6. The process of claim 1 wherein the gas has a thermal conductivity of between about $70 \times 10^{-5}$ and $80 \times 10^{-5}$ g.cal./(sec.·cm$^2$)(°C./cm) at 800° K.

7. The method of claim 1 wherein the gas consists of at least about 70% helium by volume.

8. The method of claim 1 wherein the gas contains at least about 80% helium by volume.

9. A Czochralski method for producing a single crystal silicon rod wherein a single crystal silicon rod is pulled from a silicon melt contained in a crucible within a chamber, the method comprising:

cooling the chamber by flowing a helium-containing gas into the chamber after the single crystal silicon rod is pulled from the silicon melt.

10. A method of cooling a monocrystal within a crystal pulling apparatus of the type which produces monocrystals by the Czochralski method, the crystal pulling apparatus including a growth chamber, a crucible in the growth chamber, a pulling chamber above the growth chamber, a heating apparatus within the growth chamber for heating the crucible, insulation in the growth chamber and disposed generally circumferentially about the heating apparatus for resisting heat losses from the crucible, and a cooling apparatus disposed generally circumferentially about the insulation for cooling the crucible, the method comprising:

evacuating the growth chamber after the crystal has been pulled;

energizing the cooling apparatus;

introducing an inert gaseous fluid having a thermal conductivity of at least about $55 \times 10^{-5}$ g.cal./(sec.·cm$^2$) (°C./cm) at 800° K, into the growth chamber; and holding the inert gaseous fluid in the growth chamber to increase the cooling effectiveness of the cooling apparatus.

11. A method as set forth in claim 10 wherein the step of introducing the inert gaseous fluid into the growth chamber causes the gaseous fluid to fill pores in the insulation to thereby increase heat transfer through the insulation.

12. A method as set forth in claim 11 wherein the inert gaseous fluid is a helium-containing gas containing at least about 70% helium by volume.

13. A method as set forth in claim 12 wherein the helium-containing gas is held in the growth chamber at a pressure of at least approximately 50 torr.

14. A Czochralski method for producing a single crystal silicon rod wherein a single crystal silicon rod is pulled from a silicon melt contained in a crucible within a chamber under a continuous flow of inert gas while the crucible and the chamber interior are maintained at a temperature greater than about 500° C. and at a pressure of less than about 1 torr by application of a vacuum to the chamber, the method comprising:

discontinuing the flow of inert gas to the chamber and discontinuing the application of vacuum to the chamber while the crucible and chamber interior are at a temperature of at least about 500° C.;

flowing a helium-containing gas into the chamber and thereby increasing the pressure within the chamber to at least about 50 torr; and cooling the chamber by maintaining the pressure within the chamber at at least about 50 torr until the temperature of the chamber interior and crucible are below about 250° C.

15. The method of claim 14 wherein said inert gas used to purge the chamber during crystal pulling is argon.

16. A Czochralski method for producing a single crystal silicon rod wherein a single crystal silicon rod is pulled from a silicon melt contained in a crucible within a chamber having inner walls lined with insulation, the temperature of the crucible and the chamber interior being maintained at a temperature of at least about 500° C., the method comprising:

cooling the crucible and chamber interior to a temperature below about 250° C. after the crystal is pulled by infiltrating pores of the insulation with a helium-containing gas to increase the insulation's thermal conductivity, thereby causing heat to be pulled away from the crucible and chamber interior.

17. A Czochralski method for producing a single crystal silicon rod wherein a single crystal silicon rod is pulled from a silicon melt contained in a crucible within a chamber having insulation on its inner walls, the chamber being purged with a continuous flow of an inert gas and the temperature of the chamber interior being maintained at a temperature greater than about 500° C. and at a pressure of less than about 1 torr by application of a vacuum to the chamber, the method comprising:

discontinuing the flow of inert gas to the chamber and discontinuing the application of vacuum to the chamber after the crystal is pulled while the crucible and chamber interior are at a temperature of at least about 500° C.;

flowing a helium-containing gas into the chamber to increase the pressure within the chamber to at least about 50 torr and to infiltrate pores of the insulation with the helium-containing gas, thereby increasing the thermal conductivity of the insulation and the rate at which the insulation causes heat to be pulled away from the crucible and chamber interior; and cooling the crucible and chamber interior to a temperature below about 250° C. by maintaining the pressure within the chamber at at least about 50 torr until the temperature of the chamber interior and crucible are below about 250° C.

18. A Czochralski method for producing a single crystal silicon rod wherein a single crystal silicon rod is pulled from a silicon melt contained in a crucible within a chamber having insulation on its inner walls, the chamber being purged with a continuous flow of an inert gas at a flowrate of between about 20 and about 150 liters per minute and the temperature of the chamber interior being maintained at a temperature greater than about 500° C. by application of a heat source thereto and at a pressure of less than about 1 torr by application of a vacuum to the chamber, the method comprising:

discontinuing application of said heat source;

discontinuing said flow of inert gas to the chamber and discontinuing the application of vacuum to the chamber while the crucible and chamber interior are at a temperature of at least about 500° C.;

flowing an inert gas containing at least 70% helium by volume into the chamber to increase the pressure within the chamber to at least about 50 torr and to infiltrate pores of the insulation with the gas containing at least 70% helium by volume, thereby increasing the thermal conductivity of the insulation and the rate at which the insulation causes heat to be pulled away from the crucible and chamber interior; and cooling the crucible and chamber interior to a temperature below about 250° C. by maintaining the pressure within the chamber at at least about 50 torr until the temperature of the chamber interior and crucible are below about 250° C.

19. A Czochralski method for producing monocrystals wherein a single crystal silicon rod is pulled from a silicon melt contained in a crucible within a chamber having an interior temperature of at least about 500° C., the method comprising:

cooling the chamber interior to a temperature of less than about 250° C. by flowing a gas having a thermal conductivity of at least about $55 \times 10^{-5}$ g.cal./(sec.·cm$^2$) (°C./cm) at 800° K into the chamber after the single crystal silicon rod is pulled from the silicon melt.

20. A Czochralski method for producing a single crystal silicon rod wherein a single crystal silicon rod is pulled from a silicon melt contained in a crucible within a chamber under a continuous flow of inert gas, the method comprising:

pulling the single crystal silicon rod from the silicon melt under a continuous flow of argon;

cooling the chamber interior to a temperature of less than about 250° C. by flowing a gas having a thermal conductivity of at least about $55 \times 10^{-5}$ g.cal./(sec.·cm$^2$) (°C./cm) at 800° K into the chamber after the single crystal silicon rod is pulled from the silicon melt.

\* \* \* \* \*